(12) United States Patent
Chen et al.

(10) Patent No.: US 11,874,712 B2
(45) Date of Patent: Jan. 16, 2024

(54) THERMAL WAKE SUPPRESSOR

(71) Applicant: Quanta Computer Inc., Taoyuan (TW)

(72) Inventors: Chao-Jung Chen, Taoyuan (TW);
Herman Tan, Taoyuan (TW);
Tien-Juei Chuang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 175 days.

(21) Appl. No.: 17/647,042

(22) Filed: Jan. 5, 2022

(65) Prior Publication Data

US 2023/0213987 A1 Jul. 6, 2023

(51) Int. Cl.
*G06F 1/20* (2006.01)
*H05K 7/20* (2006.01)

(52) U.S. Cl.
CPC ........... *G06F 1/20* (2013.01); *H05K 7/20727* (2013.01)

(58) Field of Classification Search
CPC .............................. G06F 1/20; H05K 7/20727
See application file for complete search history.

(56) References Cited

U.S. PATENT DOCUMENTS

| 8,081,444 | B2* | 12/2011 | Xiao | G06F 1/20 361/752 |
| 8,411,437 | B2* | 4/2013 | Shu | G06F 1/20 361/695 |
| 8,638,554 | B2* | 1/2014 | Wei | H05K 7/20727 174/16.3 |
| 10,729,038 | B1* | 7/2020 | Colwell | H05K 7/20872 |
| 10,890,956 | B1* | 1/2021 | Henderson | G06F 1/206 |
| 2012/0127664 | A1* | 5/2012 | Shu | G06F 1/20 361/695 |
| 2012/0155021 | A1* | 6/2012 | Wei | H05K 7/20727 361/690 |
| 2012/0327586 | A1* | 12/2012 | Sun | G06F 1/20 361/679.33 |

(Continued)

FOREIGN PATENT DOCUMENTS

| CN | 110278683 A | 9/2019 |
| CN | 113188750 A | 7/2021 |

OTHER PUBLICATIONS

TW Office Action for Application No. 111118823, dated Sep. 20, 2023, w/ First Office Action Summary, 6 pp.

(Continued)

*Primary Examiner* — Stephen S Sul
(74) *Attorney, Agent, or Firm* — NIXON PEABODY LLP (57) ABSTRACT

According to certain aspects of the present disclosure, a system includes a heat-generating component and a thermal wake suppressor positioned downstream from the heat-generating component. The heat-generating component produces a thermal wake in a downstream direction. The thermal wake suppressor includes a spacing grid and a plurality of twist plates extending from the spacing grid at an angle. The spacing grid is defined by a plurality of longitudinal ribs and a plurality of transverse ribs that form a plurality of intersections. The plurality of twist plates is periodically arranged on the plurality of longitudinal ribs and the plurality of transverse ribs, such that a subset of the plurality of twist plates is arranged to break apart the thermal wake into sub-vortexes in the downstream direction.

20 Claims, 10 Drawing Sheets

(56) References Cited

U.S. PATENT DOCUMENTS

| | | | |
|---|---|---|---|
| 2012/0327589 A1* | 12/2012 | Sun | G06F 1/181 |
| | | | 361/679.47 |
| 2017/0094832 A1* | 3/2017 | Pitwon | H05K 7/20836 |
| 2017/0094833 A1* | 3/2017 | Pitwon | H05K 7/20145 |
| 2022/0053668 A1* | 2/2022 | Ferrer Medina | G06F 1/20 |
| 2023/0119484 A1* | 4/2023 | Chen | F28D 1/0308 |
| | | | 361/688 |

OTHER PUBLICATIONS

TW Search Report for Application No. 111118823, dated Sep. 20, 2023, w/ First Office Action, 1 p.

* cited by examiner

THERMAL WAKE SUPPRESSOR

FIELD OF THE INVENTION

The present invention relates to an apparatus for suppressing thermal wake downstream from a heat-generating component.

BACKGROUND OF THE INVENTION

Thermal wake is a high-temperature and low-velocity region that is immediately behind a heat-generating component (e.g., in an electronic system). Thermal wake is caused by a turbulent vortex bubble, which prevents thermal mixing, and in turn causes a high-temperature region. Unlike some other issues related to cooling, thermal wake cannot be solved by increasing the amount of airflow in the electronic system. Instead, due to the nature of the turbulence, increased airflow velocity creates a larger vortex bubble, and in turn, leads to a worse local hotspot and a longer hot tail of the thermal wake. Therefore, it is common to leave a large space behind a high-power component, to avoid its downstream component being negatively affected by the thermal wake region behind the high-power component.

However, with the growing performance demands, high-density systems are becoming mainstream in the market, thereby prioritizing the utilization of any available space, including the thermal wake regions. Thus, a need exists for a solution to suppress the local hotspot of thermal wake. The present disclosure is directed to solving these problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a thermal wake suppressor includes a spacing grid and a plurality of twist plates. The spacing grid is defined by a plurality of longitudinal ribs and a plurality of transverse ribs that form a plurality of intersections. The plurality of longitudinal ribs includes M number of longitudinal ribs. The plurality of transverse ribs includes N number of transverse ribs. The plurality of intersections includes (M−1)×(N−1) number of intersections. The spacing grid has an exterior frame, which includes two of the longitudinal ribs and two of the transverse ribs. The spacing grid contains the plurality of intersections. The plurality of twist plates extends from the spacing grid in a downstream direction from a heat-generating component. The plurality of twist plates is periodically arranged on at least some of the plurality of longitudinal ribs and at least some of the plurality of transverse ribs. A subset of the plurality of twist plates is arranged to break apart a thermal wake caused by the heat-generating component into sub-vortexes in the downstream direction.

In some examples, the plurality of intersections includes a first intersection between a first pair of adjacent twist plates, and a second intersection between a second pair of adjacent twist plates. The first pair of adjacent twist plates extends from a longitudinal rib of the plurality of longitudinal ribs. The second pair of adjacent twist plates extends from a first transverse rib of the plurality of transverse ribs. The second intersection is adjacent to the first intersection. In some such examples, the first intersection and the second intersection are formed by the same longitudinal rib. In some other such examples, the first intersection and the second intersection are formed by the same transverse rib.

In some examples, a first twist plate of the first pair of adjacent twist plates extends from the longitudinal rib in an inclined angle, and a second twist plate of the first pair of adjacent twist plates extends from the longitudinal rib in a declined angle. In some examples, a first twist plate of the second pair of adjacent twist plates extends from the transverse rib in a first angle, and a second twist plate of the second pair of adjacent twist plates extends from the transverse rib in a second angle.

In some examples, the plurality of intersections further includes a third intersection between a third pair of adjacent twist plates, and a fourth intersection between a fourth pair of adjacent twist plates. The third pair of adjacent twist plates extends from a second transverse rib of the plurality of transverse ribs. The third intersection is adjacent to the first intersection. The fourth pair of adjacent twist plates extends from a third transverse rib of the plurality of transverse ribs. The fourth intersection is also adjacent to the first intersection.

In some examples, the plurality of longitudinal ribs is evenly spaced. In some examples, two adjacent longitudinal ribs and two adjacent transverse ribs form four intersections. In some such examples, the four intersections define a rectangular opening through which a sub-vortex is caused to be formed. In some such examples, the rectangular opening is square.

According to certain aspects of the present disclosure, a system includes a heat-generating component and a thermal wake suppressor positioned downstream from the heat-generating component. The heat-generating component produces a thermal wake in a downstream direction. The thermal wake suppressor includes a spacing grid and a plurality of twist plates extending from the spacing grid at an angle. The spacing grid is defined by a plurality of longitudinal ribs and a plurality of transverse ribs that form a plurality of intersections. The plurality of twist plates is periodically arranged on the plurality of longitudinal ribs and the plurality of transverse ribs, such that a subset of the plurality of twist plates is arranged to break apart the thermal wake into sub-vortexes in the downstream direction.

In some examples, the plurality of twist plates extends from a side of the spacing grid facing away from the heat-generating component. In some examples, the angle is directly proportional to a length of the thermal wake. In some examples, a size of each twist plate is directly proportional to a length of the thermal wake.

In some examples, the system is a computing system. In some such examples, wherein the heat-generating component is a memory module. In some examples, the thermal wake suppressor is configured to localize an airflow from the heat-generating component into a plurality of sub-vortices, thereby enhancing thermal mixing and reducing an effect of the thermal wake. In some examples, adjacent twist plates of the plurality of twist plates extend from the spacing grid toward different directions.

According to certain aspects of the present disclosure, a suppressor for suppressing a thermal wake generated by a computing device in a downstream direction is disclosed as follows. The suppressor includes a grid formed by a plurality of longitudinal ribs intersecting a plurality of transverse ribs, and a plurality of plates being attached to and extending from the grid. Each plate is angled to direct the thermal wake in the downstream direction. A subset of the plurality of plates is angled toward at least four different directions, such that the subset of the plurality of plates is arranged to break apart the thermal wake into one or more sub-vortexes in the downstream direction.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

The present disclosure relates to a thermal wake suppressor having (i) a spacing grid defined by a plurality of longitudinal ribs and a plurality of transverse ribs, and (ii) a plurality of twist plates extending from the spacing grid and periodically arranged on the plurality of longitudinal ribs and the plurality of transverse ribs. The thermal wake suppressor aids in suppressing the local hot spot of thermal wake that is downstream from a heat-generating component, by breaking the vortex bubble and enhancing thermal mixing.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
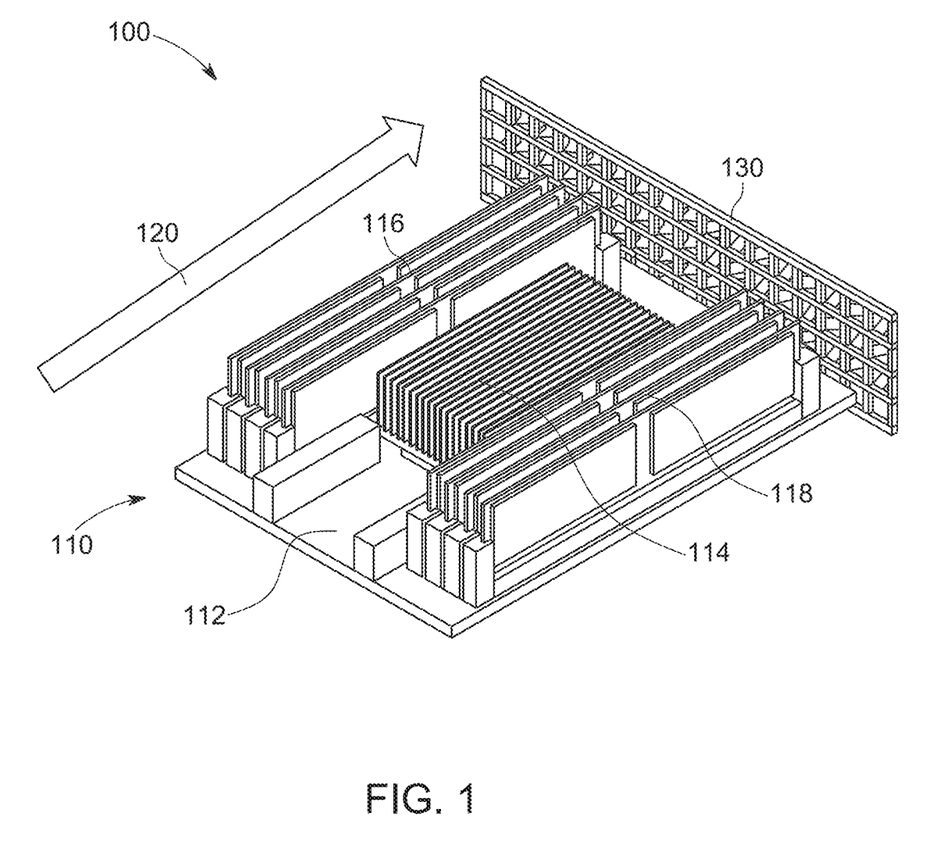
FIG. 1 is a top perspective view showing a thermal wake suppressor in a computing system, according to certain aspects of the present disclosure.

Referring to FIG. 1, a top perspective view of a thermal wake suppression system 100 is shown, according to certain aspects of the present disclosure. The thermal wake suppression system 100 includes a computing system 110 and a thermal wake suppressor 130. The computing system 110 includes a motherboard 112, two dual in-line memory modules (DIMMs) 116 and 118 installed on the motherboard 112, and a heat sink 114 (with chipset) installed between DIMM 116 and DIMM 118. In this example, the DIMM 116 and DIMM 118 are the major heat-generating components for this system, each of the DIMM 116 and DIMM 118 typically creates a hot spot of thermal wake immediately downstream in the airflow direction 120. To reduce and/or suppress the thermal wake, the thermal wake suppressor 130 is positioned downstream from the DIMM 116 and the DIMM 118.

Figure 2:
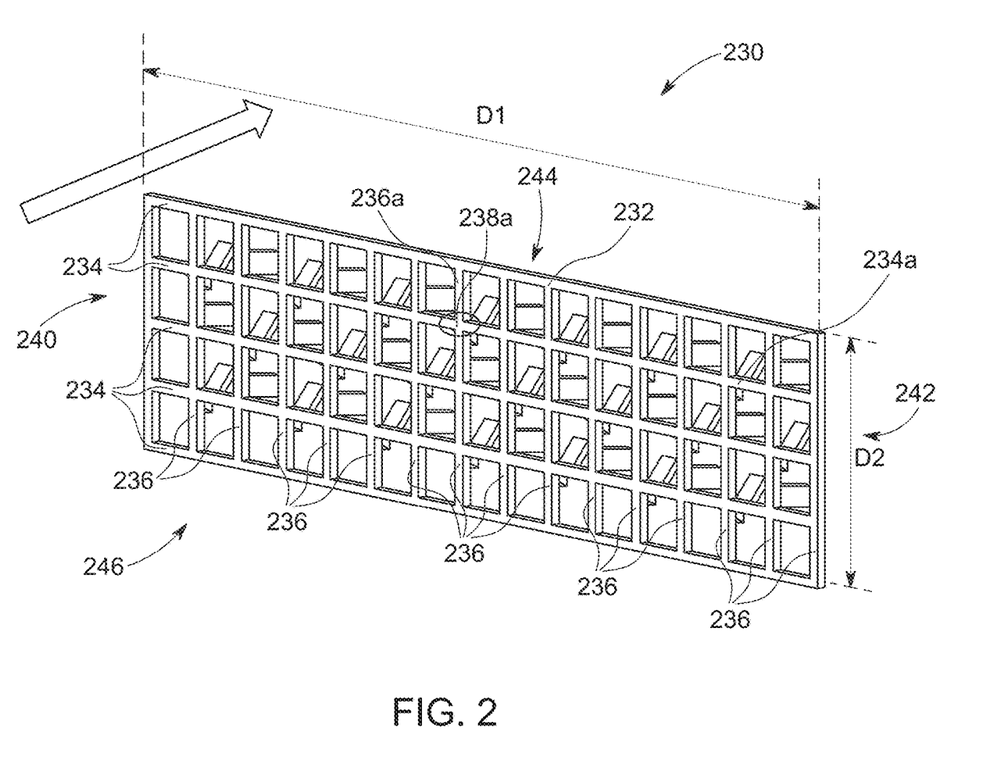
FIG. 2 is a front perspective view showing a thermal wake suppressor, according to certain aspects of the present disclosure.

FIG. 2 shows a front perspective view of a thermal wake suppressor 230, according to certain aspects of the present disclosure. The thermal wake suppressor 230 is the same as, or similar to, the thermal wake suppressor 130 shown in FIG. 1, where like reference numerals designate like elements, except that the thermal wake suppressor 230 includes fewer transverse ribs 236 than the thermal wake suppressor 130. The thermal wake suppressor 230 includes a spacing grid 232, which is defined by a plurality of longitudinal ribs 234 and a plurality of transverse ribs 236. The spacing grid 232 is framed by the two outermost longitudinal ribs 234 and the two outermost transverse ribs 236. Each longitudinal rib 234 extends from a first side 240 to a second opposing side 242 of the spacing grid 232. The distance between the first side 240 and the second side 242 defines a length D1 of the spacing grid 232. Each transverse rib 236 extends from a top 244 to a bottom 246 of the spacing grid 232. The distance between the top 244 and the bottom 246 defines a height D2 of the spacing grid 232. In this example, the plurality of longitudinal ribs 234 and the plurality of transverse ribs 236 are rigid and linear (e.g., straight), and thus the spacing grid 232 is rectangular in shape.

The spacing grid 232 contains a plurality of intersections, formed by the plurality of longitudinal ribs 234 and the plurality of transverse ribs 236. For example, the longitudinal rib 234a (i.e., second longitudinal rib from the top 244 of the spacing grid 232) and the transverse rib 236a (i.e., eighth transverse rib from the first side 240 to the second side 242 of the spacing grid 232) intersects at the intersection 238a. Other than the outermost ribs, two adjacent longitudinal ribs 234 and two adjacent transverse ribs 236 form four intersections, which define a rectangular opening (or cell). In this example, the plurality of longitudinal ribs 234 is evenly spaced, and the plurality of transverse ribs 236 is evenly spaced; therefore, the rectangular openings are square. Generally, the smaller opening is better for reducing and/or suppressing thermal wake. However, a thermal wake suppressor with smaller openings is harder to manufacture. In this example, an opening with 2 mm-5 mm length or width is preferred for a thermal wake suppressor behind a DIMM (e.g., 8×DDR-5).

For a thermal wake suppressor of the present disclosure (e.g., the thermal wake suppressor 130 or 230), if the plurality of longitudinal ribs includes M number of longitudinal ribs, and the plurality of transverse ribs includes N number of transverse ribs, then the plurality of intersections includes (M−1)×(N−1) number of intersections. In the example of the thermal wake suppressor 230, there are five (5) longitudinal ribs 234 and sixteen (16) transverse ribs 236; therefore the thermal wake suppressor 230 includes (5−1)×(16−1)=60 intersections.

Figure 3:
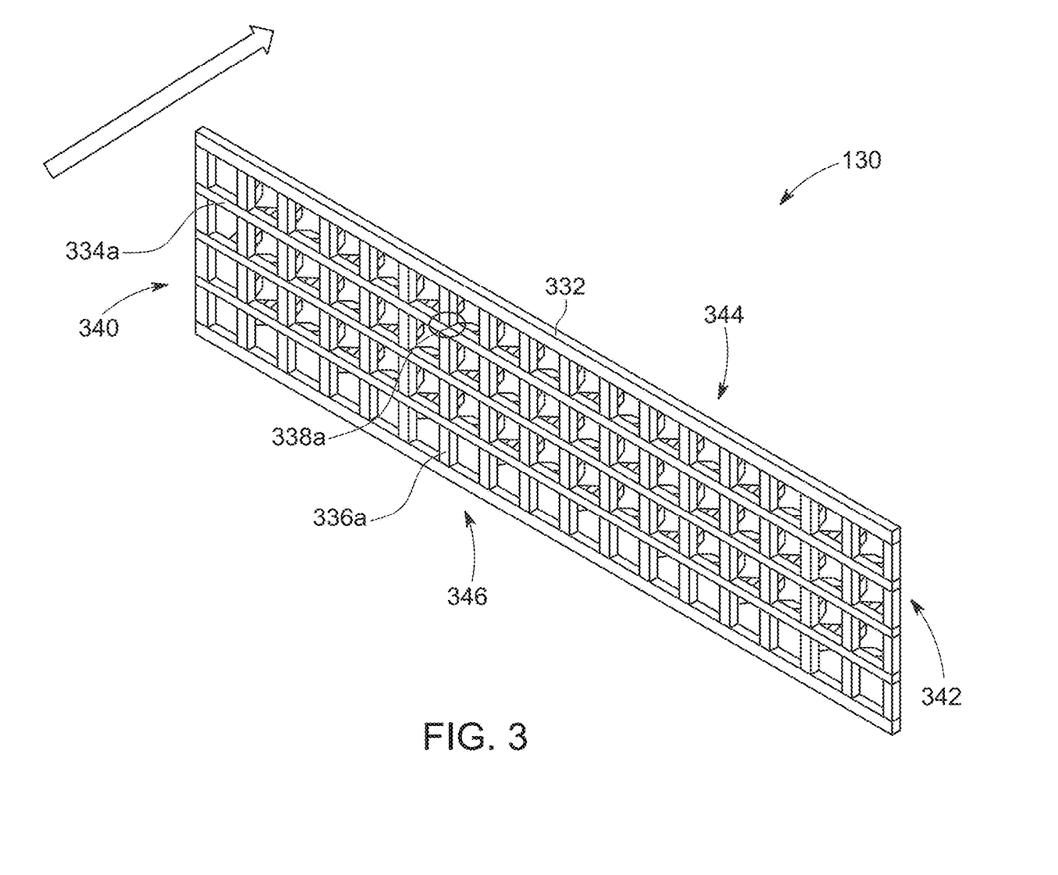
FIG. 3 is a front perspective view showing the thermal wake suppressor of FIG. 1.

Referring to FIG. 3, a front perspective view of the thermal wake suppressor 130 is shown. The thermal wake suppressor 130 is the same as, or similar to, the thermal wake suppressor 230 shown in FIG. 2, where like reference numerals designate like elements, except that the thermal wake suppressor 230 includes fewer transverse ribs 236 than the thermal wake suppressor 130. As shown in FIG. 3, the longitudinal rib 334a (i.e., second longitudinal rib from the top 344 of the spacing grid 332) and the transverse rib 336a (i.e., seventh transverse rib from the first side 340 to the second side 342 of the spacing grid 332) intersects at the intersection 338a. For the thermal wake suppressor 130, there are five (5) longitudinal ribs and eighteen (18) transverse ribs; therefore the thermal wake suppressor 130 includes (5−1)×(18−1)=68 intersections.

Figure 4:
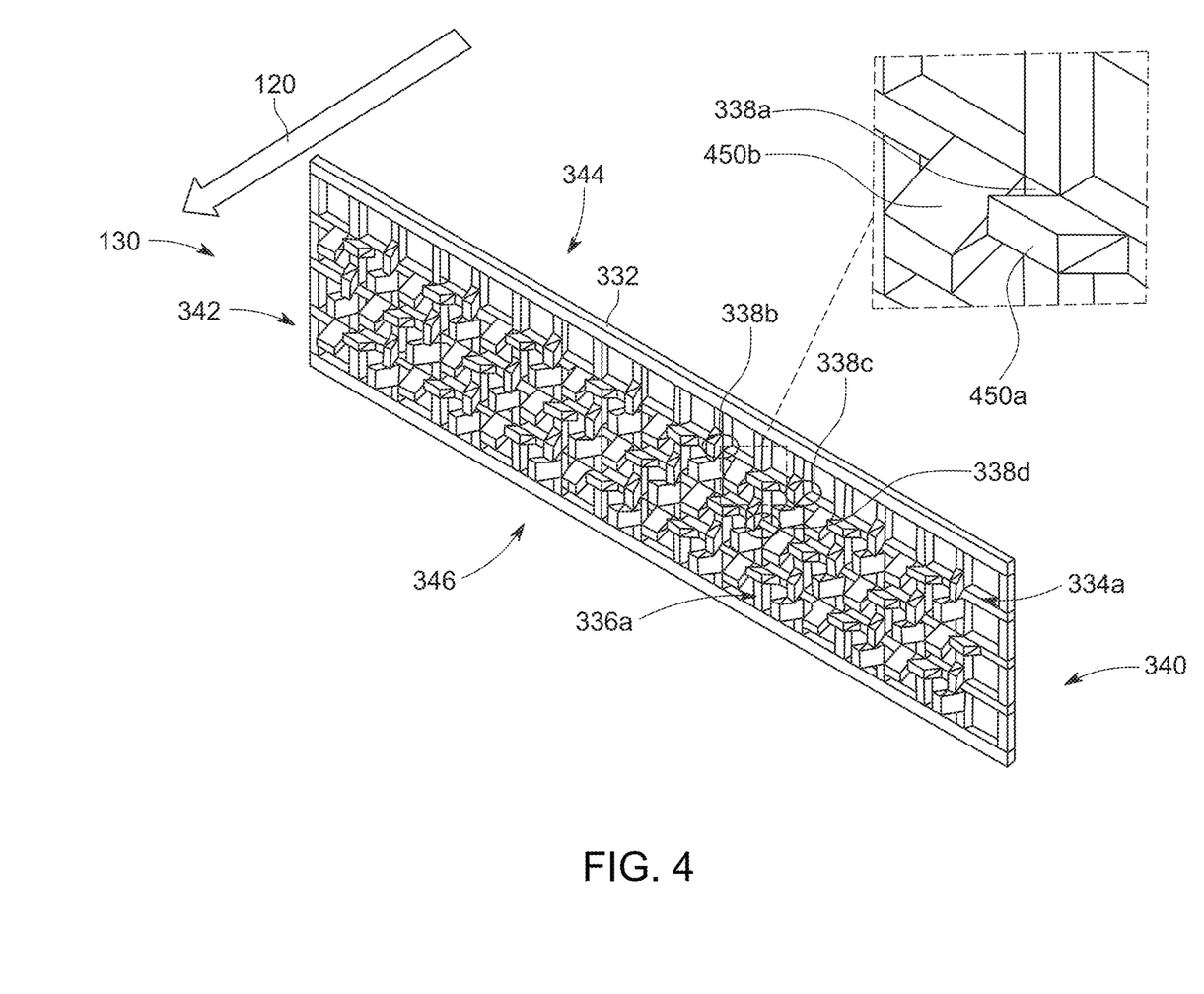
FIG. 4 is a rear perspective view showing the thermal wake suppressor of FIG. 1.

Referring to FIG. 4, a rear perspective view of the thermal wake suppressor 130 is shown. The thermal wake suppressor 130 shown in FIG. 4 is the same as, or similar to, the thermal wake suppressor 130 shown in FIG. 3, where identical reference numerals designate identical elements. The thermal wake suppressor 130 further includes a plurality of twist plates extending from the spacing grid 332 downstream of the airflow direction 120. The plurality of twist plates is periodically arranged on the plurality of longitudinal ribs and the plurality of transverse ribs.

The enlarged view shows a pair of twist plates 450a and 450b positioned adjacent to the intersection 338a. Specifically, the twist plates 450a and 450b extend from the longitudinal rib 334a, and are positioned on opposing sides of the transverse rib 336a. The twist plates 450a and 450b extend from the spacing grid 332 in different directions. In this example, the twist plate 450a extends from the longitudinal rib 334a at an inclined angle (i.e., towards the airflow direction 120 and the top 344). The twist plate 450b extends from the longitudinal rib 334a at a declined angle (i.e., towards the airflow direction 120 and the bottom 346).

There are three intersections 338b, 338c, and 338d adjacent to the intersection 338a. The intersections 338b and 338c are both formed on the same longitudinal rib 334a as is the intersection 338a. The intersection 338c is formed on the same transverse rib 336a as is the intersection 338a. Each of the three intersections 338b, 338c, and 338d is positioned between a corresponding pair of twist plates extending from a transverse rib (instead of a longitudinal rib such as in the case of the intersection 338a) on opposing sides of a longitudinal rib (instead of a transverse rib such as in the case of the intersection 338a. A first twist plate of each corresponding pair of twist plates extends from the transverse rib in a first angle (i.e., towards the airflow direction 120 and the first side 340). A second twist plate of each corresponding pair of twist plates extends from the transverse rib in a second angle (i.e., towards the airflow direction 120 and the second side 342).

Figure 5:
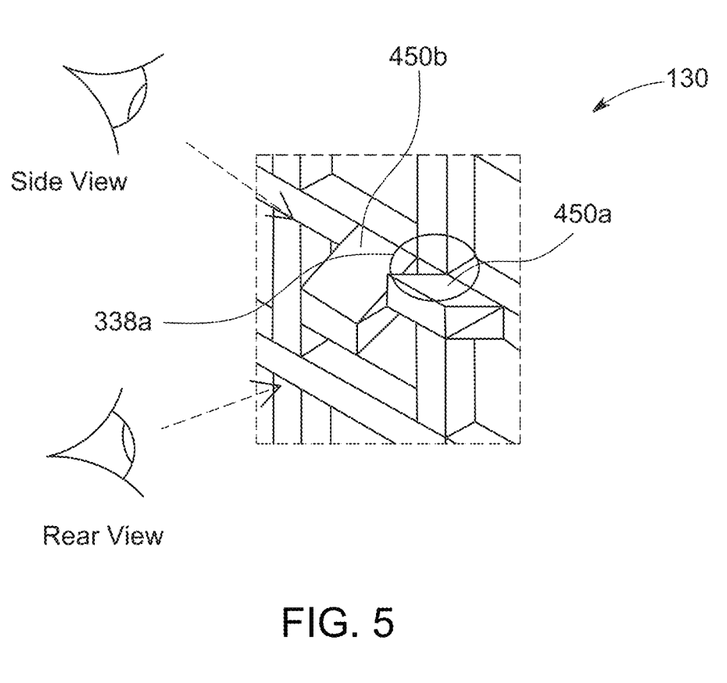
FIG. 5 is a rear perspective view showing an intersection of the thermal wake suppressor of FIG. 1.
Figure 6:
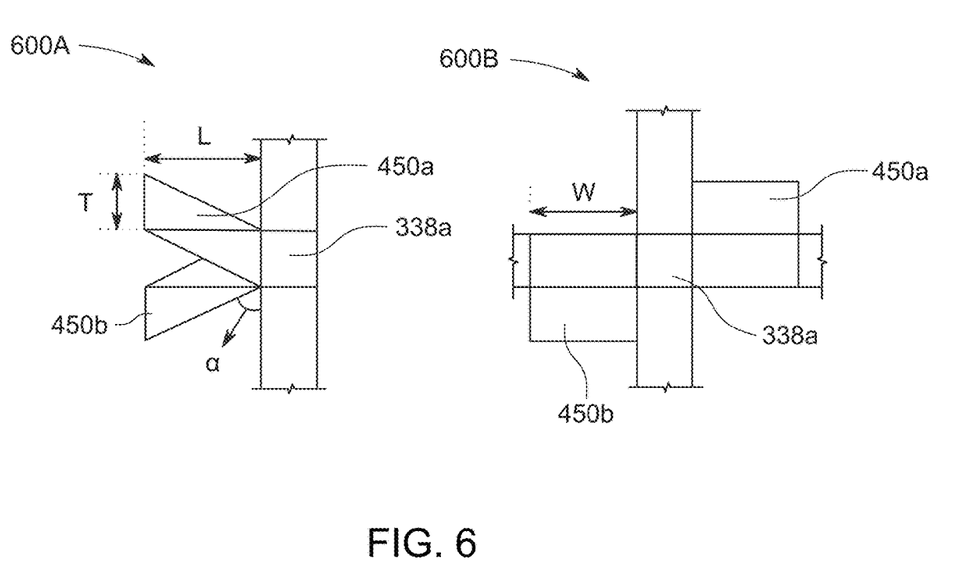
FIG. 6 shows a side elevation view and a rear elevation view of the intersection of FIG. 5.

Referring to FIG. 5, a rear perspective view of the intersection 338a of the thermal wake suppressor 130 is shown. The intersection 338a is positioned between the twist plate 450a and the twist plate 450b. Referring to FIG. 6, a side elevation view 600A and a rear elevation view 600B of the intersection 338a of FIG. 5 are shown. In some implementations, the twist plate 450a is inclined at an angle $\alpha$ (e.g., about 30 to 60 degrees). The twist plate 450b is declined at the angle $\alpha$. In some implementations, the angle $\alpha$ is directly proportional to a length of the thermal wake generated by the heat-generating component behind which the thermal wake suppressor 130 (FIG. 1) is placed. Both the size of the spacing grid 332 (FIG. 3) and the angle $\alpha$ of the twist plates could be adjusted based on encountered thermal wake. For example, when the thermal wake of the heat-generating component is longer, the size of twist plate is larger, and/or the angle $\alpha$ is larger.

The twist plates 450a and 450b extend from the spacing grid 332 at a length L (e.g., about 2 mm to 8 mm). Each of the twist plates 450a and 450b has a thickness T (e.g., about or less than 2 mm), and a width W (e.g., about half of the opening). Additionally or alternatively, in some implementations, the size and/or dimensions of each twist plate are directly proportional to a length of the thermal wake generated by the heat-generating component behind which the thermal wake suppressor is placed. In some implementations, the thickness T of each twist plate is about ½ of the width W of the twist plate. In some implementations, the width W of each twist plate is about ½ of the width of the opening. In some implementations, the length L of each twist plate is about ½ of the width of the opening. In some implementations, the ratio of the width W to the length L of each twist plate is about 1:1.

Figure 7:
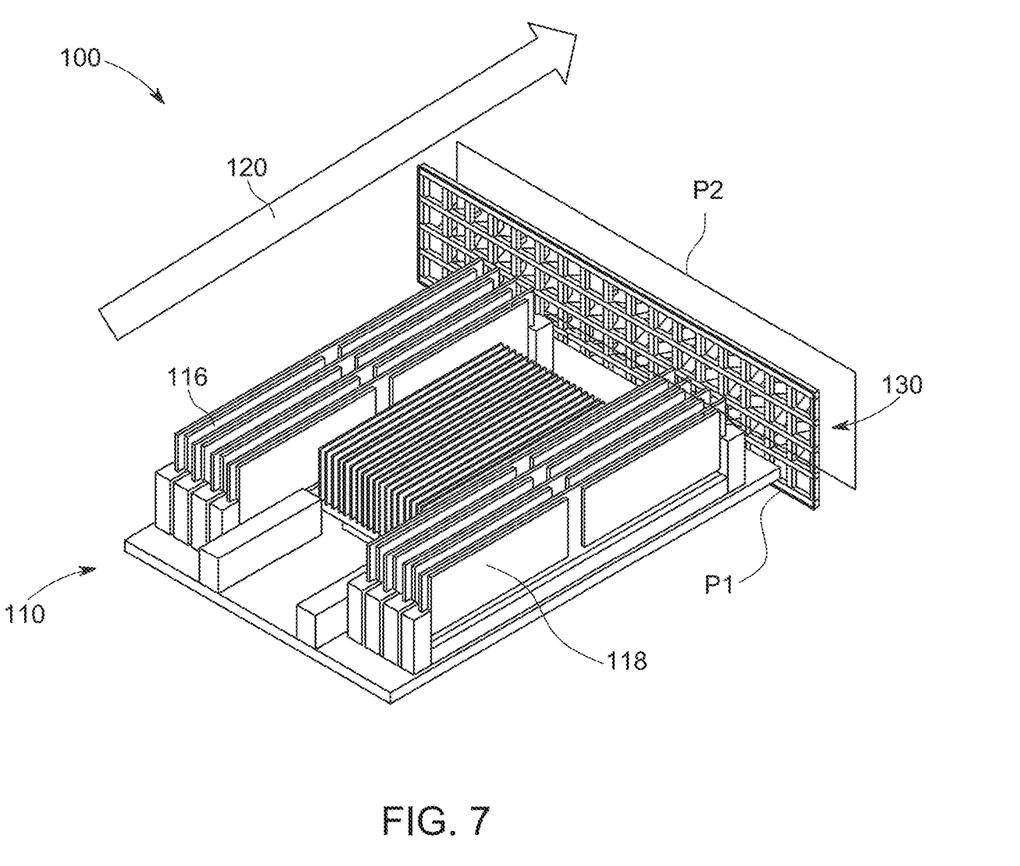
FIG. 7 is a top perspective view showing the thermal wake suppressor in the computing system of FIG. 1 and two cut planes, according to certain aspects of the present disclosure.

Referring to FIG. 7, a top perspective view of the thermal wake suppression system 100 is shown, according to certain aspects of the present disclosure. The thermal wake suppression system 100 shown in FIG. 7 is the same as, or similar to, the thermal wake suppression system 100 shown in FIG. 1, where identical reference numerals designate identical elements, except that FIG. 7 additionally illustrates a first cut plane P1 and a second cut plane P2. The airflow direction 120 shows that air flows through the thermal wake suppressor 130 from the heat generating components (e.g., the DIMMS 116 and 118), travels to the first cut plane P1 (at the spacing grid 332 (FIG. 3) of the thermal wake suppressor 130), then travels to the second cut plate P2 (at a distance from the thermal wake suppressor 130).

Figure 8:
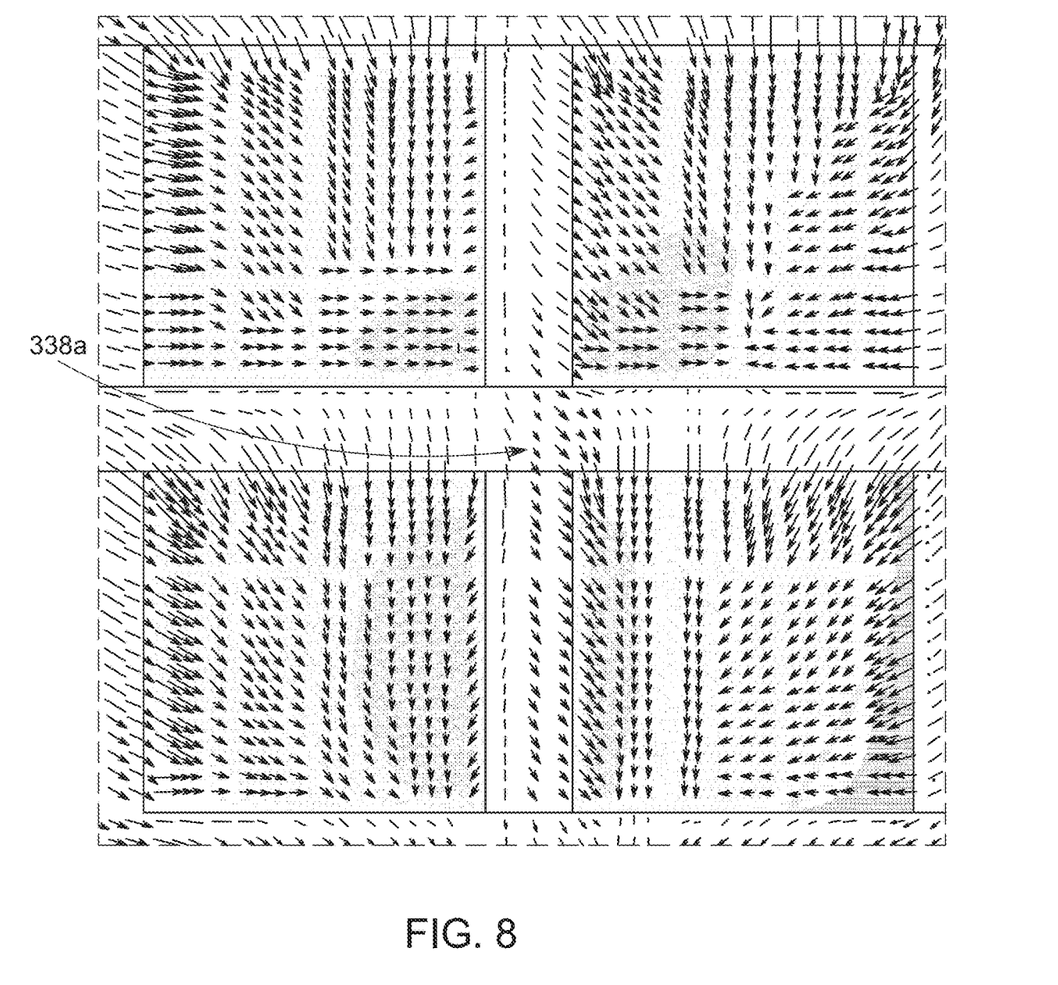
FIG. 8 illustrates a thermal flow through an intersection of a thermal wake suppressor at the first cut plane of FIG. 7, according to certain aspects of the present disclosure.

When the thermal wake flows through the thermal wake suppressor 130, the spacing grid 332 (FIGS. 3-4) localizes the flow into several small vortexes. For example, FIG. 8 illustrates the thermal flow through four openings adjacent to the intersection 338a at the first cut plane P1 (FIG. 7). The thermal flow is being localized into small vortexes, as illustrated in the heat map shown in FIG. 8.

Figure 9:
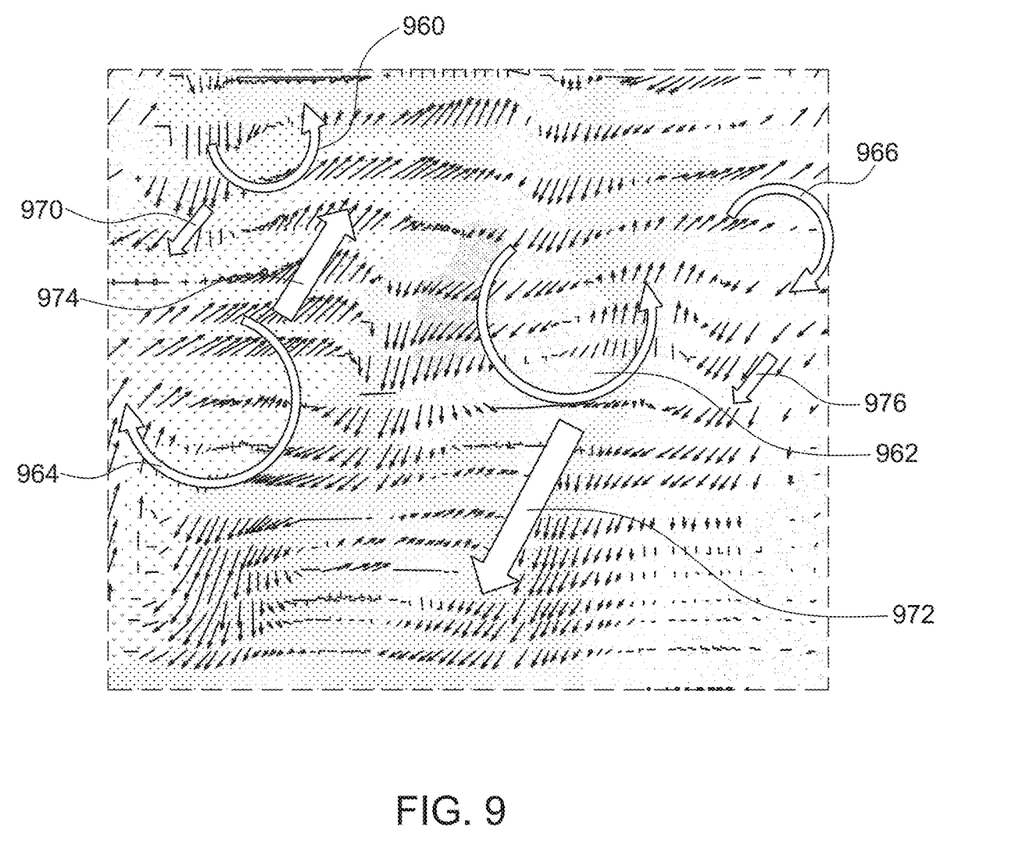
FIG. 9 illustrates a thermal flow through an intersection of a thermal wake suppressor at the second cut plane of FIG. 7, according to certain aspects of the present disclosure.

FIG. 9 illustrates the thermal flow through the intersection 338a at the second cut plane P2 (FIG. 7), according to certain aspects of the present disclosure. As shown, air is re-directed by the twist plates into small vortexes, either in a counterclockwise direction or a clockwise direction. In this example, there are two counterclockwise small vortexes 960 and 962, and two clockwise small vortexes 964 and 966. The small vortex 960 travels towards direction 970. The small vortex 962 travels towards direction 972. The small vortex 964 travels towards direction 974. The small vortex 966 travels towards direction 976. Thus, air from each small vortex is then mixed together with air from other small vortexes. The temperature is then averaged to a lower number, thereby reducing and/or suppressing the hot spots of thermal wake. The enhanced thermal mixing between vortexes lowers pre-heated temperature and/or thermal wake generated by the heat-generating component.

Figure 10:
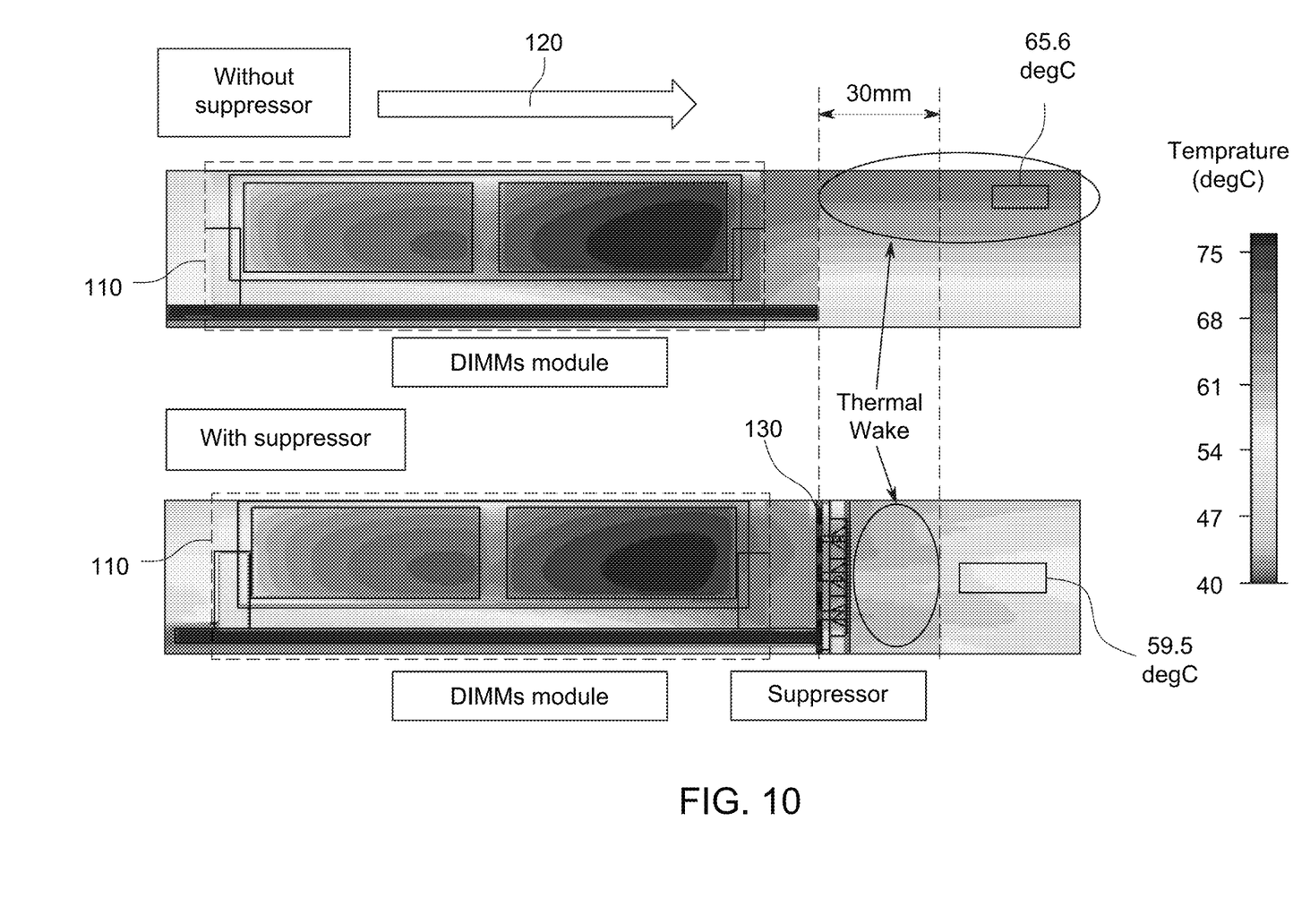
FIG. 10 illustrates a comparison of thermal maps between a computing system without a thermal wake suppressor and a computing system with a thermal wake suppressor, according to certain aspects of the present disclosure.

Referring to FIG. 10, a comparison of thermal maps between the computing system 110 without a thermal wake suppressor and the computing system 110 with a thermal wake suppressor (e.g., the thermal wake suppressor 130) is illustrated, according to certain aspects of the present disclosure. In this example, the thermal wake suppressor 130 is placed about 30 mm from the computing system 110. In this CFD study example, DIMMs are utilized as example heat-generating components, to demonstrate the performance of the thermal wake suppressor 130. The CFD simulation results provide that the thermal wake suppressor 130 is effective in lowering downstream temperature from the heat-generating components, such as DIMMs.

In the system without a thermal wake suppressor, there exists a long thermal wake (as shown in the upper circle of FIG. 10) behind the DIMMs, with a temperature reaching up to 65.6° C. and covering around 30 mm behind the DIMMs. However, the overall downstream temperature is only averaged to around 46.5° C. Thus, there exists a hotspot of airflow, created by the thermal wake. By placing the thermal wake suppressor 130 behind the DIMMs, the thermal flow is separated into several small vortexes, redirected, and mixed with other small vortexes. Thus, the thermal wake in this scenario (as shown in the lower circle of FIG. 10) is significantly shorter than the system without a thermal wake suppressor. The hot spot of the thermal wake is also decreased by 6.1° C., to 59.5° C. This hot spot reduction is highly beneficial for a high-density system (e.g., a server system), in order to lower the pre-heat effect from an upstream component to a downstream component.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A thermal wake suppressor comprising:
   a spacing grid defined by a plurality of longitudinal ribs and a plurality of transverse ribs that form a plurality of intersections, the plurality of longitudinal ribs including M number of longitudinal ribs, the plurality of transverse ribs including N number of transverse ribs, the plurality of intersections including $(M-1)\times(N-1)$ number of intersections, the spacing grid (i) having an exterior frame including two of the plurality of longitudinal ribs and two of the plurality of transverse ribs and (ii) containing the plurality of intersections; and
   a plurality of twist plates extending from the spacing grid in a downstream direction from a heat-generating component, the plurality of twist plates being periodically arranged on at least some of the plurality of longitudinal ribs and at least some of the plurality of transverse ribs, wherein a subset of the plurality of twist plates is arranged to break apart a thermal wake caused by the heat-generating component into sub-vortexes in the downstream direction.

2. The thermal wake suppressor of claim 1, wherein the plurality of intersections includes:
   a first intersection between a first pair of adjacent twist plates extending from a longitudinal rib of the plurality of longitudinal ribs; and
   a second intersection between a second pair of adjacent twist plates extending from a first transverse rib of the plurality of transverse ribs, the second intersection being adjacent to the first intersection.

3. The thermal wake suppressor of claim 2, wherein the first intersection and the second intersection are formed by the same longitudinal rib.

4. The thermal wake suppressor of claim 2, wherein the first intersection and the second intersection are formed by the same transverse rib.

5. The thermal wake suppressor of claim 2, wherein a first twist plate of the first pair of adjacent twist plates extends from the longitudinal rib in an inclined angle, and a second twist plate of the first pair of adjacent twist plates extends from the longitudinal rib in a declined angle.

6. The thermal wake suppressor of claim 2, wherein a first twist plate of the second pair of adjacent twist plates extends from the first transverse rib in a first angle, and a second twist plate of the second pair of adjacent twist plates extends from the first transverse rib in a second angle.

7. The thermal wake suppressor of claim 2, wherein the plurality of intersections further includes:
- a third intersection between a third pair of adjacent twist plates extending from a second transverse rib of the plurality of transverse ribs, the third intersection being adjacent to the first intersection; and
- a fourth intersection between a fourth pair of adjacent twist plates extending from a third transverse rib of the plurality of transverse ribs, the fourth intersection being adjacent to the first intersection.

8. The thermal wake suppressor of claim 1, wherein the plurality of longitudinal ribs is evenly spaced.

9. The thermal wake suppressor of claim 1, wherein two adjacent longitudinal ribs and two adjacent transverse ribs form four intersections.

10. The thermal wake suppressor of claim 9, wherein the four intersections define a rectangular opening through which a sub-vortex is caused to be formed.

11. The thermal wake suppressor of claim 10, wherein the rectangular opening is square.

12. A system comprising:
- a heat-generating component producing a thermal wake in a downstream direction; and
- a thermal wake suppressor positioned downstream from the heat-generating component, the thermal wake suppressor including:
  - a spacing grid defined by a plurality of longitudinal ribs and a plurality of transverse ribs that form a plurality of intersections; and
  - a plurality of twist plates extending from the spacing grid at an angle, the plurality of twist plates being periodically arranged on the plurality of longitudinal ribs and the plurality of transverse ribs, such that a subset of the plurality of twist plates is arranged to break apart the thermal wake into sub-vortexes in the downstream direction.

13. The system of claim 12, wherein the plurality of twist plates extends from a side of the spacing grid facing away from the heat-generating component.

14. The system of claim 12, wherein the angle is directly proportional to a length of the thermal wake.

15. The system of claim 12, wherein a size of each twist plate is directly proportional to a length of the thermal wake.

16. The system of claim 12, wherein the system is a computing system.

17. The system of claim 16, wherein the heat-generating component is a memory module.

18. The system of claim 12, wherein the thermal wake suppressor is configured to localize an airflow from the heat-generating component into a plurality of sub-vortices, thereby enhancing thermal mixing and reducing an effect of the thermal wake.

19. The system of claim 12, wherein adjacent twist plates of the plurality of twist plates extend from the spacing grid toward different directions.

20. A suppressor for suppressing a thermal wake generated by a computing device in a downstream direction, the suppressor comprising:
- a grid formed by a plurality of longitudinal ribs intersecting a plurality of transverse ribs; and
- a plurality of plates being attached to and extending from the grid, each plate of the plurality of plates being angled to direct the thermal wake in the downstream direction, a subset of the plurality of plates being angled toward at least four different directions such that the subset of the plurality of plates is arranged to break apart the thermal wake into one or more sub-vortexes in the downstream direction.

* * * * *